United States Patent
Hsu et al.

[11] Patent Number: 6,160,737
[45] Date of Patent: Dec. 12, 2000

[54] BIAS CONDITIONS FOR REPAIR, PROGRAM AND ERASE OPERATIONS OF NON-VOLATILE MEMORY

[75] Inventors: Fu-Chang Hsu; Hsing-Ya Tsao, both of Taipei, Taiwan; Peter Wung Lee, Saratoga, Calif.

[73] Assignee: APLUS Flash Technology, Inc., Santa Clara, Calif.

[21] Appl. No.: 09/369,761

[22] Filed: Jul. 6, 1999

Related U.S. Application Data

[60] Provisional application No. 60/096,103, Aug. 10, 1998.

[51] Int. Cl.[7] .................................................. G11C 16/04
[52] U.S. Cl. ............................... 365/185.24; 365/185.27; 365/185.29; 365/185.33
[58] Field of Search ......................... 365/185.24, 185.18, 365/185.27, 185.29, 185.3, 185.33

[56] References Cited

U.S. PATENT DOCUMENTS

| | | | |
|---|---|---|---|
| 5,416,738 | 5/1995 | Shrivastava | 365/185 |
| 5,687,118 | 11/1997 | Chang | 365/185.19 |
| 5,742,541 | 4/1998 | Tanigamai et al. | 365/185.3 |
| 5,894,438 | 4/1999 | Yang et al. | 365/185.18 |
| 5,903,494 | 5/1999 | Papadas et al. | 365/185.01 |
| 5,999,011 | 12/1999 | Chu et al. | 324/769 |
| 6,005,809 | 12/1999 | Sung et al. | 365/185.29 |

*Primary Examiner*—Richard Elms
*Assistant Examiner*—Hien Nguyen

[57] ABSTRACT

Bias conditions for improving the efficiency of repairing, programming and erasing the threshold voltages of non-volatile memory devices. A positive voltage is applied to the source region of a non-volatile memory cell. The control gate of the memory cell is applied with another positive voltage higher the voltage at the source region. The difference between the two voltages is proportional to the desired final threshold voltage. The drain region can be applied with a positive voltage directly from the power supply of the memory device. A negative voltage is applied to the bulk of the memory device so that a large electric field across the control gate and the bulk can induce hot-electron injection. By selecting the proper voltage level at the control gate, the method can be used for the repair, program or erase operation of memory devices.

4 Claims, 5 Drawing Sheets

Repair time ≃ 100ms
Final Vt ≃ +1V

Repair time ≃ 100uS
Final Vt ≃ +1V

Repair time ≈ 10uS
Final Vt ≈ +2.5V

Repair time ≈ 10uS
Final Vt ≈ +1V

| | Affective factors | Low $V_{GS}$ Repair (Prior art) | High $V_{GS}$ Repair (Prior art) | Shifting $V_{GS}$ Repair (Invention) |
|---|---|---|---|---|
| Bias Conditions | $V_G$ | +1.4V | +3V | +3V |
| | $V_D$ | +3.3V | +3.3V | +3.3V |
| | $V_S$ | 0V | 0V | +1.6V |
| | $V_B$ | -3V | -3V | -3V |

(A)

| | | | | |
|---|---|---|---|---|
| Repair Efficiency | $V_{GB}$ | +4.4V | +6V | +6V |
| | $V_{DB}$ | +6.3V | +6.3V | +6.3V |
| Ranking | | Worst | Best | Best |

(B)

| | | | | |
|---|---|---|---|---|
| Final Vt | $V_{GS}$ | +1.4V | +3V | +1.4V |
| | $V_{SB}$ | +3V | +3V | +4.6V |
| Ranking | | Middle | Worst | Best |

(C)

| | | | | |
|---|---|---|---|---|
| Channel Current | $V_{DS}$ | +3.3V | +3.3V | +1.7V |
| | $V_{GS}$ | +1.4V | +3V | +1.4V |
| | $V_{SB}$ | +3V | +3V | +4.6V |
| Ranking | | Worst | Worst | Best |

EXAMPLE

| V1 | V2 | V3 | V4 |
|---|---|---|---|
| +2V | +1V | +1V | -6V |

BIAS CONDITIONS FOR REPAIR, PROGRAM AND ERASE OPERATIONS OF NON-VOLATILE MEMORY

This application claims the benefit of U.S. Provisional Application No. 60/096,103, filed Aug. 10, 1998.

FIELD OF INVENTION

This invention relates to the repair, program and erase operations of non-volatile memories, and more specifically to the bias conditions of the repair, program and erase operations for flash or EEPROM memories.

BACKGROUND OF INVENTION

Different from a normal random access memory (RAM) that can be randomly read, erased and programmed on a byte basis, a conventional EPROM-type flash memory features a byte-program and a block-erase capability with each block containing a number of bytes. Because the data within a memory block can not be selected for erasure individually, a flash memory has to erase the data of a whole block of memory cells, i.e., an erase block, and then program the new data byte by byte.

As is well known, erasing a block of cells may cause a serious problem that the cells having faster erasing speed may be over-erased. The threshold voltage Vt of an over-erased cell becomes negative and consequently can not be shut off by the ground voltage which is generally applied to the gates of non-selected cells in a read operation. In a standard NOR architecture array, the over-erased cells conduct leakage current and cause errors in the read operation. To solve this problem, the Vt's of over-erased cells are typically programmed back to positive by a repair operation.

Various bias conditions have been described in prior arts for the repair operation, but they all suffer different drawbacks. Among the repair approaches developed in the industry during the past years, the most distinguished ones may be those using the mechanism of hot-electron injection. Because hot-electron injection has the advantage that the final Vt of the cell can be better controlled after the repair operation, it has been preferred over other mechanisms such as Fowler-Nordheim tunneling.

In the mechanism of hot-electron injection, the Vt of the cell is increased by hot-electron injection induced by the channel current. The Vt of the cell automatically saturates at a final Vt when it is sufficiently high to turn the channel current off. Therefore, the cell will not be over-repaired too much. The distribution of the Vt's of a large number of cells after repair can be easily controlled within a tight region.

U.S. Pat. No. 5,521,867 probably represents the most famous prior art that discloses the repair operation using hot-electron injection. The bias condition of the repair approach is shown in FIG. 1. The drain is applied with a voltage around +6.5V and both the gate and the source are grounded. This bias condition is almost identical to the conventional bias condition for programming using channel hot-electron except that the gate voltage is +8V in a programming operation.

The reason of using a ground voltage 0V as the gate voltage is that the final Vt is desired to be around +1V. At the beginning, the Vt of an over-erased cell is lower than 0V that causes large channel current to conduct and hot-electron injection to occur. The Vt of the cell is gradually increased until it reaches a value close to +1V which turns off the channel current. Therefore, no sufficient current continues to generate hot-electron and the final Vt of the cell saturates at around +1V after repairing.

This prior art successfully repairs the Vt of an over-erased cell to +1V. However, there are a number of drawbacks in this conventional repairing approach. One drawback is that it requires large drain current such as 500 uA per cell during the repair operation. The large current makes it difficult to provide the drain voltage from an on-chip charge pump circuit. In addition, to get the +6.5V drain voltage it is often necessary that the power supply voltage be pumped up by the charge pump circuit because the power supply voltage of the industry standard today is moving toward +3V. It is especially true for a handheld equipment.

Furthermore, the supply current of the charge pump circuit limits the number of memory cells that can be repaired in parallel. As described in the prior art, it is suggested that the repair operation be performed byte by byte rather than a bit line or a block at one time because the charge pump circuits can not afford the large repairing current. Otherwise, the pump circuits may be overloaded and the repair operation will fail.

However, byte by byte repairing prolongs the total repair time to several orders of the time for repairing one byte. On the other hand, simply lowering the supply current of the drain can also result in drastically long time needed to repair the cells. Therefore, the very long repair time is another drawback associated with the conventional repair approach. Using the conventional bias condition for repairing, the repair time is approximately 100 ms for repairing a single cell. It can take up to several seconds to repair all the over-erased cells in the array. This long repair time is usually considered part of the time of an erase operation. The erase time is consequently long and the yield of a repair operation is reduced.

Recently, substrate bias condition of a flash memory cell has attracted wide industrial interest. By having a negative substrate voltage, the drain voltage can be lowered while still maintaining constant drain to bulk voltage $V_{DB}$. Therefore, it significantly reduces the supply current requirement of the drain pump circuits without sacrificing the repair efficiency as compared to the conventional repair approach. This is advantageous especially when the pump circuit is needed in order to work under low power supply environment, such as +3V.

An early development of the approach involving substrate bias is described in a published paper entitled "Substrate-Current-Induced Hot Electron (SCIHE) Injection: A New Convergence Scheme for Flash Memory", IEEE Tech. Dig. IEDM 1995, pp. 283–286. Referring to FIG. 2 for the bias condition of this approach. The cell is applied with a negative substrate voltage, −3V, and the drain voltage is reduced from the conventional +6.5V to +4.5V only.

As can be seen, this repair condition reduces the required drain voltage by 2V, thus reducing the loading of the charge pump circuit. As is well known, the supply current of a charge pump circuit has a strong reverse-ratio to the pump's output voltage. Therefore, the repairing yield can be improved and the required area of the pump circuits can be reduced. Note that the gate voltage is applied with +1.4V and the final Vt of the cell is measured around 1V.

However, this approach still can not solve the long repair time problem associated with the repair operations that rely on hot-electron injection. The paper shows that the repair time is 100 us per cell when the drain voltage is applied with +4.5V. A person skilled in the art should understand that if +3.3V power supply is applied to the drain, the repairing time will be dramatically prolonged to at least two orders. To make a fair comparison in the later part of this specification, a +3.3V will be used as the drain voltage for this art in the rest of this document.

Another prior art in a published paper entitled "Secondary Electron Flash—a High Performance, Low Power Flash Technology for 0.35 um and Below", IEEE Tech. Dig. IEDM 1997, pp. 279–282, describes a bias condition as shown in FIG. 3. The gate is applied with +3V to +5V rather than +1.4V as in the previously described prior art. By increasing the gate voltage, it generates stronger vertical electric field for increasing the hot-electron injection into the floating gate. The programming time is dramatically shortened from several mini seconds to 10 us range.

However, this approach can only be applied to a programming operation to enhance the conventional channel hot-electron programming rather than a repair operation. The limitation is due to the fact that the Vt of the cell saturates at a much higher voltage because of the higher gate voltage. As shown in the paper, if the gate voltage is applied with +3V, the final Vt of the cell does not saturate until it reaches +2.5V. If the gate voltage is applied with +5V, the cells' Vt does not saturate until +4.2V. This high final Vt is not acceptable for a repair operation because it requires mush lower final Vt, such as +1V, to have reasonable current in a read operation.

As a result, both prior art approaches using negative substrate voltage have their own problems. For the low gate voltage approach, the repair efficiency is low. For the high gate voltage approach, the high final Vt prevents it from being used for a repair operation.

SUMMARY OF THE INVENTION

This invention has been made to overcome the above mentioned drawbacks of the bias conditions of repair operations in the prior arts. The primary object of this invention is to provide a novel bias condition for a repair operation that can repair a memory cell with high efficiency and low channel current. Another object of the invention is to provide a bias condition that does not require high voltage from charge pump circuits.

According to the bias condition of the repair operation in this invention, a positive voltage is applied to the source. The gate voltage is set to be higher than the source voltage in order for the cell to have a final Vt that is saturated at around +1V. The drain is applied with a voltage that is approximately the power supply voltage. Because of the lower drain voltage, it can be provided directly from the power supply. The channel current is small because of the lower voltage difference between the drain and the source. The bulk is applied with a negative voltage to increase the electric field across the gate and the bulk for increasing the hot-electron injection and the repair efficiency.

The gate voltage of the invention can also be adjusted higher so that the final Vt of the cell will saturate at a higher level. With higher gate voltage, the bias condition of this invention can be used for a pre-program or program operation with high efficiency. Therefore, it is also an object of the invention to provide an efficient bias condition for a program or pre-program operation.

Because the high efficiency of the bias condition in the present invention can program the data of a whole memory chip in one shot, it is suitable for performing the chip-erase operation of an EEPROM. Accordingly, it is also an object of the invention to provide a bias condition for an efficient chip-erase operation.

The present invention will be better understood from the following description of preferred embodiments with reference to the accompanied drawings.

BRIEF DESCRIPTION OF THE DRAWINGS

FIG. 5 compares the bias condition, repair efficiency and channel current among the prior arts and this invention.

DETAILED DESCRIPTION OF THE PREFERRED EMBODIMENTS

Figure 4:
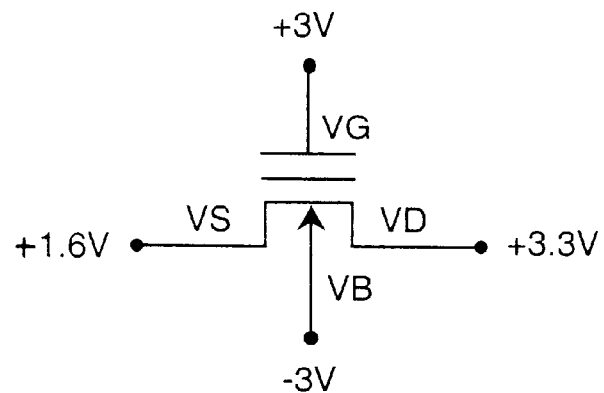
FIG. 4 shows the bias condition of the repair operation of this invention in which the source is applied with a positive voltage.

The key point of innovation in the present invention is to shift the voltages of both the source and the gate of a memory cell to a higher level for a repair operation. With reference to FIG. 4, an example of the preferred bias condition of this invention for a repair operation has a positive source voltage $V_S$ of approximately 1.6V, a gate voltage $V_G$ of approximately +3.0V, a negative substrate voltage $V_G$ of approximately −3V, and a drain voltage $V_D$ of approximately +3.3V.

The principle and advantage of this invention will be analyzed by studying the voltage differences between the gate and the bulk $V_{GB}$, the drain and the bulk $V_{DB}$, the gate and the source $V_{GS}$, the source and the bulk $V_{SB}$, and the drain and the source $V_{DS}$. As is known, the repair efficiency is proportional to the voltage differences $V_{GB}$ and $V_{DB}$, and the magnitude of the channel current is proportional to the voltage difference $V_{DS}$. It is therefore desirable to have higher $V_{GB}$ and lower $V_{DS}$ in order to repair a cell efficiently without having to use large channel current. In addition, it is also important that $V_{GS}$ be kept low so that the final threshold voltage Vt is a small positive voltage.

Figure 1:
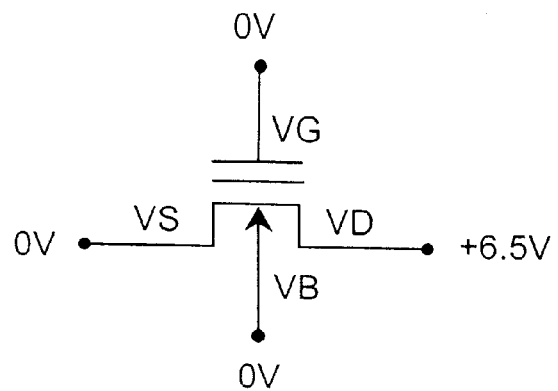
FIG. 1 shows the bias conditions of a conventional repair operation in which both gate, source and bulk voltages are set to the ground level.
Figure 2:
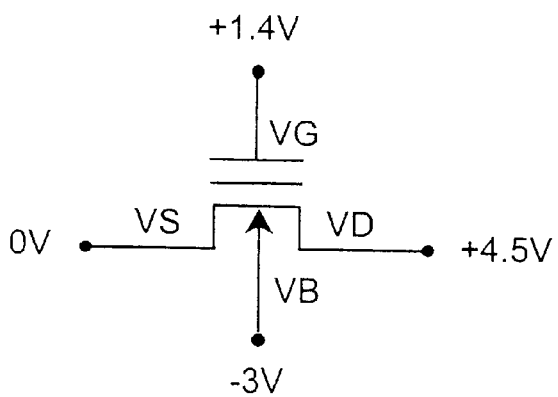
FIG. 2 shows the bias condition of another conventional repair operation in which the gate voltage is increased to a positive voltage and the bulk is applied with a negative voltage.

According to the example of FIG. 4, the voltage difference $V_{GB}$ is increased to 6V from 4.4V as compared to FIG. 2 while $V_{GS}$ is still maintained constant at 1.4V. The repair efficiency is thus increased without having to increase the final Vt of the cell. Because of the use of a positive source voltage, the voltage difference $V_{DS}$ is decreased and the channel current is also reduced. Therefore, the bias condition of FIG. 4 achieves the desirable condition of a repair operation.

Figure 3:
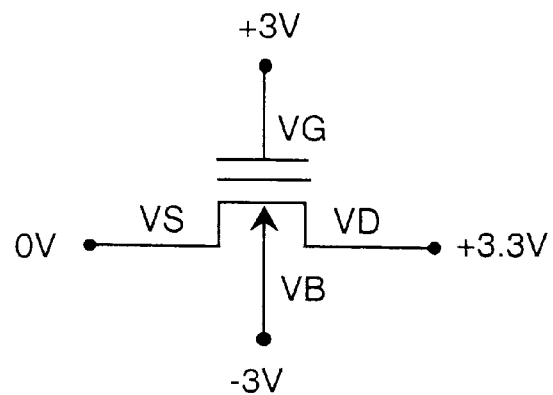
FIG. 3 shows the bias condition of a conventional program operation in which a higher positive voltage is applied to the gate for increasing the final Vt of the cell.

In order to show the advantages of the present invention, FIGS. 5A–5C compare the bias conditions and the voltage differences for the prior arts of FIGS. 2–3 with the embodiment of the present invention as shown in FIG. 4. The approach of FIG. 2 is named "low $V_{GS}$ repair" because it has low voltage difference between the gate and the source. The approach of FIG. 3 is named "high $V_{GS}$ repair" because of the high $V_{GS}$. For convenience, the embodiment of this invention is named "shifting $V_{GS}$ repair" because both source and gate voltages are shifted higher as compared to FIG. 2.

FIG. 5A lists the bias conditions for the two prior art approaches and the approach of the present invention. The voltage levels of $V_G$, $V_D$, $V_S$ and $V_B$ in each approach are shown for comparison. FIG. 5B compares the repair efficiency of each approach. Theoretically, the hot-electron injection efficiency is positively proportional to the $V_{GB}$ and $V_{DB}$. By linearly shifting up both gate and source voltages with +1.6V from the low $V_{GS}$ repair approach, the present invention has the same $V_{GB}$ and $V_{DB}$ as the high $V_{GS}$ repair approach. Therefore, the invention has very high repair efficiency. The repair time of the invention is estimated to dramatically decrease to 10 us range, as observed in the high $V_{GS}$ repair approach.

FIG. 5C shows the comparison of the final Vt of each approach. Because both ate and source voltages in the present invention are raised by the same magnitude, i.e., +1.6V, the gate to source voltage $V_{GS}$, is kept the same as the low $V_{GS}$ repair approach. Therefore, the final Vt of the cell saturates at around +1V rather then +2.5V as observed in the high $V_{GS}$ repair approach. A low converged threshold voltage Vt is realized.

Besides, because of the high $V_{SB}$, the invention has the highest body effect and the channel current is turned off the earliest. The Vt of the cell then can be controlled lower than the prior arts while the same gate voltage is applied. This increases the safety margin of over-repairing. As a result, a gate voltage higher than +3V can even be used to increase the repair efficiency. Fast low-Vt convergence without over-repairing can be achieved.

FIG. 5D shows the comparison of the channel current during the repair operation. The channel current is positively proportional to the $V_{GS}$ and $V_{DS}$. As shown in the figure, by increasing the source voltage, the invention has the lowest $V_{GS}$ and $V_{DS}$ among the three bias conditions. In addition, high $V_{SB}$ increases the body effect. Thus, the cell's threshold voltage Vt is increased, which causes the channel current to decrease. As a result, the channel current of this invention is significantly reduced down to the range of uA. This makes it possible to repair thousands of over-erased cells on a bit line in parallel at the same time.

In summary, by linearly shifting up both source and gate voltages, the invention provides a novel bias condition for repairing over-erased cells with very high efficiency, low and tightly converged Vt, and very low channel current.

Figure 6:
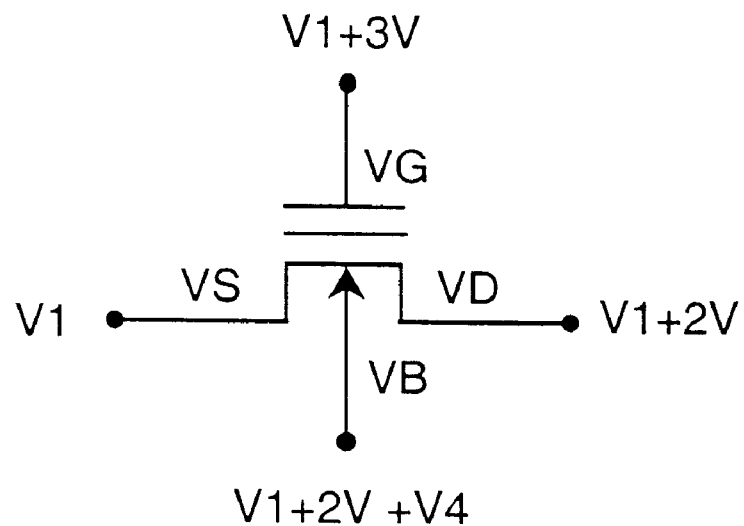
FIG. 6 illustrates the principle of determining the voltage levels at each node for the bias condition of this invention.

As mentioned above, the bias conditions of the four nodes of a cell are strongly dependent. One has to carefully select the voltage applied to each node in order to achieve the optimal operation. FIG. 6 illustrates the relationship among each node. The preferred approach of selecting the voltages for the bias condition is to give the source a positive voltage V1 first. The positive voltage V1 is used to suppress the channel current and control the converged Vt of the cell. The drain voltage is then determined to be V1+V2, where V2 controls the channel current. Higher V2 will result in higher channel current.

In the preferred embodiment of FIG. 4, the drain voltage is preferably the power supply voltage Vdd. This bias condition eliminates the requirement of generating the drain voltage from charge pump circuits. The source voltage V1 is preferred to be about one to two volts below the drain voltage. This allows a reasonable low channel current during repairing. Next, the gate voltage is set to be V1+V3, where V3 is determined in accordance with the desired final Vt. The final Vt is converged at a value near V3. Small adjustment may be made to V3 because of the consideration of the body effect. Finally, the bulk voltage is set to be the drain voltage minus the absolute value of V4. V4 is a negative voltage determined by the required electric field across the drain and the bulk to induce the generation of hot-electron. More negative V4 results in higher repair efficiency. However, the device junction breakdown voltage limits the lowest negative V4 value.

Note that, in the preferred embodiment of FIG. 4, the source voltage and the drain voltage can be directly derived from the power supply. Therefore, the high supply current requirement of the conventional drain pump circuits is eliminated. This also allows a large number of cells to be repaired at one time. For the gate voltage, although the power supply Vdd is preferred, the gate voltage can be increased to increase the repair efficiency as well as the converged Vt of the cell.

Unlike the drain node, the gate does not conduct DC current during the repair operation. Therefore, small-size pump circuits can easily supply the gate voltage. In the present invention, negative pump circuits are also required to generate the bulk voltage. However, the bulk current is much smaller than the channel current. Therefore, the power consumption of the invention is significantly reduced compared to the conventional repair methods.

It is important to point out the difference between the invention and the prior arts. The most distinguished difference is that no ground voltage level is used in this invention. From the practice of the invention, it is found that using ground voltage in any node will cause poor performance similar to the prior arts that has been clearly discussed above. While all the prior arts have the serious drawback of applying the ground voltage level to at least one node, the present invention has presented a novel bias condition for a repair operation in which none of the nodes should be applied with ground voltage. Instead, the voltages of the four nodes of a cell are dependent upon each other. Therefore, it is clear that the bias condition and the relationship between each node disclosed in this invention are novel and distinguished from all the prior arts.

A person skilled in the art can understand that, the voltages applied to the four nodes are absolute voltages with reference to the ground level. The principle of determining the voltages as described above is based on achieving the optimal operation condition that is not obtainable from approaches of the prior arts. If these voltages were not carefully selected as described earlier, poor performances such as very low repair efficiency or over-repair problem would occur.

According to the principle described above, the invention can also be modified to it the required conditions of other operations such as programming or erasing non-volatile memory cells. In particular, the gate to source voltage $V_{GS}$, can be altered to make the final Vt of the cell either higher or lower. The change in the voltage level of $V_{GS}$ allows the invention to be used in other operations. For example, by using the same $V_S$ such as +1.6V to limit the channel current, increasing the gate voltage $V_G$ can make the final Vt of the cell converge to a higher value. Accordingly, the modified bias condition of the invention can be also used in a program operation. Thanks to the small channel current, parallel programming of a large amount of cells can be also realized.

Furthermore, the invention is particularly suitable for pre-program operations of flash memories. To reduce the over-erasure problem, a pre-program operation is frequently adopted in the operation of conventional flash memories. Before the erase operation, all the cells that are to be erased are pre-programmed to an identical Vt first. This allows the cells to be erased from an equal initial Vt so that a tighter Vt distribution can be obtained after erasure. With the pre-program operation, the Vt distribution is narrowed and the number of over-erased cells is greatly reduced.

Figure 7:
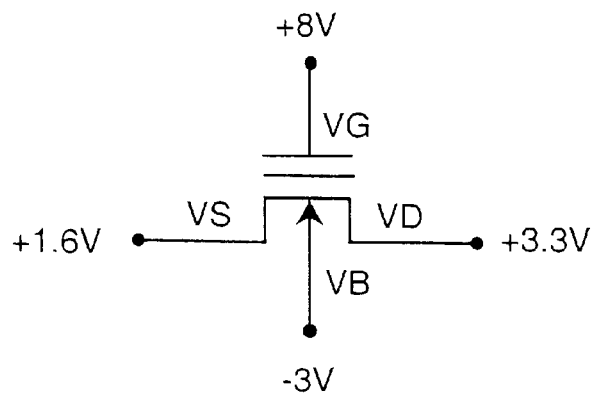
FIG. 7 shows a modified bias condition for a program operation of this invention that can be used for chip-erasing the data of a whole memory chip.

In the conventional approach, it is necessary to pre-program the cells byte by byte using channel-hot-electron injection, thus wasting a lot of power and time. In this invention, the disclosed bias condition can be applied to a large number of cells to perform the pre-program at one time. In such an operation, the gate voltage $V_G$ is applied with, for example, +8V and the voltage levels of $V_D$, $V_S$ and $V_B$ in the repair operation of FIG. 4 can still be used. FIG. 7 shows such an embodiment. In this embodiment, the programming speed is enhanced because of the increased electrical field across the gate and the bulk. The final Vt saturates at a higher value such as +6V because of the higher $V_{GS}$. Nevertheless, by keeping the low voltage at $V_D$ and the small $V_{DS}$, the drain voltage can be directly generated from the power supply.

Another application of this invention is the chip-erase operation of an EEPROM. A known industrial standard for EEPROMs is that the memory must be able to destroy the data in the whole chip within 10 ms by a chip-erasure operation. In the whole-chip erasure, the memory data may be erased to all low or programmed to all high. This requirement is specified based on the consideration of data security because an EEPROM is widely used for storing very important data such as military or banking information. The conventional channel hot-electron programming can not fulfill this requirement due to the time constraint.

Therefore, the conventional EEPROM or any EEPROM replacement memory has to be chip-erased using high-voltage Fowler-Nordheim erasure. The super high voltages applied to the cells for inducing the Fowler-Nordheim tunneling may cause long-term reliability problem of the cells. The bias condition for the high-speed programming of this invention, however, can be used to erase whole chip data in one shot using hot-electron injection. As is well known, the hot-electron injection requires much lower voltages as compared to the Fowler-Nordheim tunneling and the long term reliability of the memory is relieved.

Figure 8:
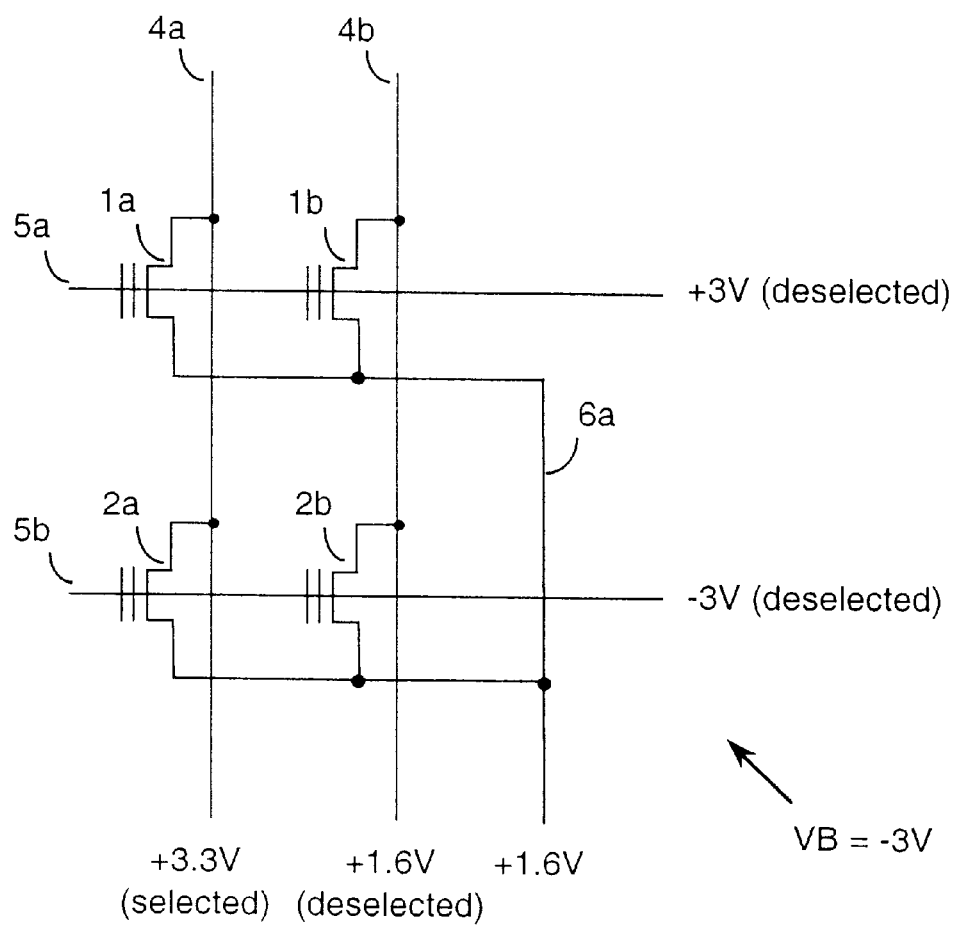
FIG. 8 shows a circuit example of applying the required voltages to the bit lines and word lines of an array of memory cells for the bias condition of this invention.

FIG. 8 illustrates an example of providing the repair condition to a plurality of cells in an array. To repair the selected cell (1a), the bit line (4a) is applied with +3.3V from Vdd, and the word line (5a) is applied with +3V. The source line (6a) is applied with +1.6V. The bulk is applied with a negative voltage −3V. Because the bulk of the cells (1a), (1b), (2a) and (2b) are connected together, the non-selected cells (1b), (2a) and (2d) will experience a bulk disturb. The −3V in the bulk will cause the Vt of a non-elected cell to increase after long time, causing data retention problem. To overcome this problem, the circuit applies a negative voltage which is the same as (or near) the bulk voltage to the non-selected word lines (5b). Consequently, the problem of bulk disturb is completely eliminated because there is no voltage difference between the gate and bulk of the non-selected cells.

Although the above description is based on a standard NOR architecture array, a person skilled in the art can understand that the invention can be applicable to any type of array architectures, such as AND or NAND architectures. In addition, as is well known, ramping techniques for establishing voltages can be applied to any nodes, $V_G$, $V_D$, $V_S$ or $V_B$, to minimize the device degradation of the memory cells. Although only the preferred embodiments of this invention were shown and described in the above description, it is requested that any modification or combination that come within the spirit of this invention be protected.

What is claimed is:

1. A method for improving the efficiency of changing the threshold voltage of a flash memory device to a desired threshold voltage, comprising the steps of:

applying a first positive voltage approximately 1.6 volts to a source region of said flash memory device;

simultaneously applying a second positive voltage approximately 3 volts to a control gate of said flash memory device;

simultaneously applying a third positive voltage approximately 3.3 volts to a drain region of said flash memory device; and simultaneously applying a negative voltage approximately −3 volts to a substrate of said flash memory device;

wherein said second positive voltage and said negative voltage have a sufficient voltage difference for inducing hot-electron injection in said flash memory device.

2. The method according to claim 1, wherein said flash memory device is an EEPROM device and said method is used for erasing all memory cells in an EEPROM memory array simultaneously.

3. A method for improving the efficiency of changing the threshold voltage of a flash memory device to a desired threshold voltage, comprising the steps of:

applying a first positive voltage approximately 1.6 volts to a source region of said flash memory device;

simultaneously applying a second positive voltage approximately 8 volts to a control gate of said flash memory device;

simultaneously applying a third positive voltage approximately 3.3 volts to a drain region of said flash memory device; and simultaneously applying a negative voltage approximately −3 volts to a substrate of said flash memory device;

wherein said second positive voltage and said negative voltage have a sufficient voltage difference for inducing hot-electron injection in said flash memory device.

4. The method according to claim 3, wherein said flash memory device is an EEPROM device and said method is used for erasing all memory cells in an EEPROM memory array simultaneously.

* * * * *